United States Patent
Charbon

(10) Patent No.: US 11,137,721 B2
(45) Date of Patent: Oct. 5, 2021

(54) BALANCE SPRING FOR TIMEPIECE MOVEMENTS AND METHOD FOR MANUFACTURING THE SAME

(71) Applicant: Nivarox-FAR S.A., Le Locle (CH)

(72) Inventor: Christian Charbon, Chezard-St-Martin (CH)

(73) Assignee: Nivarox-FAR S.A., Le Locle (CH)

( * ) Notice: Subject to any disclaimer, the term of this patent is extended or adjusted under 35 U.S.C. 154(b) by 506 days.

(21) Appl. No.: 16/214,257

(22) Filed: Dec. 10, 2018

(65) Prior Publication Data

US 2019/0196407 A1    Jun. 27, 2019

(30) Foreign Application Priority Data

Dec. 21, 2017   (EP) .................................... 17209690

(51) Int. Cl.

| | |
|---|---|
| *G04B 17/06* | (2006.01) |
| *C22C 14/00* | (2006.01) |
| *G04B 43/00* | (2006.01) |
| *C22C 27/02* | (2006.01) |
| *C22F 1/18* | (2006.01) |
| *G04B 17/22* | (2006.01) |
| *C23C 14/16* | (2006.01) |
| *C23C 16/06* | (2006.01) |

(52) U.S. Cl.
CPC ............ *G04B 17/066* (2013.01); *C22C 14/00* (2013.01); *C22C 27/02* (2013.01); *C22F 1/18* (2013.01); *C23C 14/16* (2013.01); *C23C 16/06* (2013.01); *G04B 17/063* (2013.01); *G04B 17/227* (2013.01); *G04B 43/007* (2013.01)

(58) Field of Classification Search
CPC .... G04B 17/06; G04B 17/066; G04B 17/063; G04B 17/227
See application file for complete search history.

(56) References Cited

U.S. PATENT DOCUMENTS

| | | | | |
|---|---|---|---|---|
| 3,735,971 A * | 5/1973 | Steinemann | ............ | C22C 38/04 267/182 |
| 3,928,085 A * | 12/1975 | Yamamura | ............... | C22C 19/07 148/557 |
| 3,974,001 A * | 8/1976 | Steinemann | ............ | C22C 27/00 148/400 |
| 6,402,859 B1 | 6/2002 | Ishii et al. | | |
| 9,395,692 B2 * | 7/2016 | Hirai | ........................ | C22C 38/06 |
| 10,795,317 B2 * | 10/2020 | Charbon | ................... | C21D 1/18 |
| 2002/0174922 A1 | 11/2002 | Ishii et al. | | |
| 2007/0133355 A1 * | 6/2007 | Hara | ........................ | C22C 30/00 368/140 |
| 2015/0241847 A1 * | 8/2015 | Hirai | ........................ | C22C 38/50 368/175 |
| 2019/0196405 A1 * | 6/2019 | Charbon | ................... | C22F 1/00 |
| 2021/0088971 A1 * | 3/2021 | Charbon | .............. | G04B 17/063 |

FOREIGN PATENT DOCUMENTS

| | | |
|---|---|---|
| CN | 101930208 A | 12/2010 |
| EP | 1 039 352 A1 | 9/2000 |
| EP | 1 083 243 A2 | 3/2001 |
| EP | 2 696 381 A1 | 2/2014 |
| GB | 503 070 | 3/1939 |
| GB | 1166701 | 10/1969 |
| JP | 4-279212 | 10/1992 |
| WO | WO 2005/045532 A2 | 5/2005 |
| WO | WO 2015/189278 A2 | 12/2015 |

OTHER PUBLICATIONS

Office Action dated Nov. 26, 2020 in corresponding Indian Patent Application No. 201844048109 (with English Translation), citing document AO therein, 6 pages.
Combined Chinese Office Action and Search Report dated Jun. 17, 2020, in Patent Application No. 201811561421.6 (with English translation), citing document AO therein, 12 pages.
European Search Report dated Jun. 29, 2018 in European Application 17209690.1, filed on Dec. 21, 2017 (with English Translation of Categories of Cited Documents).
Chinese Office Action dated Mar. 10, 2021 in corresponding Chinese Patent Application No. 201811561421.6 (with English Translation), 9 pages.

* cited by examiner

*Primary Examiner* — Sean Kayes
(74) *Attorney, Agent, or Firm* — Oblon, McClelland, Maier & Neustadt, L.L.P.

(57) ABSTRACT

A balance spring for a balance with a blank containing: niobium: the remainder to 100 wt %, titanium: between 40 and 60 wt %, traces of elements selected from the group formed of O, H, C, Fe, Ta, N, Ni, Si, Cu, Al, between 0 and 1600 ppm by weight individually, and less than 0.3 wt % combined, a step of β-quenching the blank with a given diameter, such that the titanium of the alloy is essentially in solid solution form with β-phase niobium, the α-phase titanium content being less than or equal to 5% by volume, at least one deformation step of the alloy alternated with at least one heat treatment step such that the niobium and titanium alloy obtained has an elastic limit higher than or equal to 600 MPa and a modulus of elasticity lower than or equal to 100 GPa, a winding step to form the balance spring being performed prior to the final heat treatment step, prior to the deformation step, a step of depositing, on the alloy blank, a surface layer of a ductile material such as copper, the surface layer of ductile material being retained on the balance spring, the thermoelastic coefficient of the niobium and titanium alloy being adapted accordingly.

25 Claims, No Drawings

BALANCE SPRING FOR TIMEPIECE MOVEMENTS AND METHOD FOR MANUFACTURING THE SAME

CROSS-REFERENCE TO RELATED APPLICATION

This application claims priority to European Patent Application No. 17209690.1 filed on Dec. 21, 2017, the entire disclosure of which is hereby incorporated herein by reference.

FIELD OF THE INVENTION

The invention concerns a balance spring intended to be fitted to a balance of a timepiece movement and a method for manufacturing such a balance spring.

BACKGROUND OF THE INVENTION

The manufacture of balance springs for horology is subject to constraints that often seem incompatible at first sight:
the need to obtain a high elastic limit,
ease of manufacture, particularly of wire drawing and rolling,
excellent fatigue resistance,
stability of performance over time,
small cross-sections.

The production of balance springs is focused on concern for temperature compensation, in order to ensure regular chronometric performance. This requires obtaining a thermoelastic coefficient that is close to zero. It is also sought to produce balance springs with limited sensitivity to magnetic fields.

Any improvement on at least one of these points, and in particular limited sensitivity to magnetic fields, temperature compensation, and ease of manufacture, particularly drawing, wire drawing and rolling, therefore represents a significant advance.

SUMMARY OF THE INVENTION

The invention proposes to define a novel type of timepiece balance spring intended to be fitted to a balance of a timepiece movement, based on the selection of a particular material, and to develop the corresponding manufacturing method.

To this end, the invention concerns a balance spring intended to be fitted to a balance of a timepiece movement, the balance spring being made from an alloy of niobium and titanium containing:
niobium: the remainder to 100 wt %,
titanium: between 40 and 60 wt %,
traces of elements selected from the group formed of O, H, C, Fe, Ta, N, Ni, Si, Cu, Al, each of said elements being present in an amount comprised between 0 and 1600 ppm by weight, the total amount formed by all of said elements being comprised between 0 and 0.3 wt %,
said alloy having an elastic limit higher than or equal to 600 MPa and a modulus of elasticity lower than 100 GPa, said alloy being coated with a surface layer of a ductile material chosen from the group including copper, nickel, cupronickel, cupro manganese, gold, silver, nickel phosphorus Ni—P and nickel boron NiB.

The present invention also concerns a method for manufacturing such a balance spring which includes:

a step of creating a blank from a niobium and titanium alloy containing:
niobium: the remainder to 100 wt %,
titanium: between 40 and 60 wt %,
traces of elements selected from the group formed of O, H, C, Fe, Ta, N, Ni, Si, Cu, Al, each of said elements being present in an amount comprised between 0 and 1600 ppm by weight, the total amount formed by all of said elements being comprised between 0 and 0.3 wt %,
a step of β-quenching said blank with a given diameter, such that the titanium of said alloy is essentially in solid solution form with β-phase niobium (centred cubic structure), the content of a phase titanium (hexagonal close-packed structure) being less than or equal to 5% by volume,
at least one deformation step of said alloy alternated with at least one heat treatment step such that the niobium and titanium alloy obtained has an elastic limit higher than or equal to 600 MPa and a modulus of elasticity lower than or equal to 100 GPa, a winding step to form the balance spring being performed prior to a final heat treatment step.

According to the invention, the method includes, before the deformation step, a step of depositing, on the alloy blank, a surface layer of a ductile material chosen from the group including copper, nickel, cupronickel, cupro manganese, gold, silver, nickel phosphorus NiP and nickel boron NiB, said surface layer of ductile material being retained on the final balance spring obtained, the thermoelastic coefficient of the niobium and titanium alloy being adapted accordingly.

The balance spring according to the invention is made from a paramagnetic niobium and titanium alloy that has the mechanical properties and thermoelastic coefficient required for use as a balance spring for a balance. It is obtained by a manufacturing method which facilitates the shaping of the NbTi alloy blank into a wire, and more specifically facilitates the drawing, wire drawing and rolling processes and allows a perfectly regular final cross-section of wire to be produced.

DETAILED DESCRIPTION OF PREFERRED EMBODIMENTS

The invention concerns a balance spring intended to be fitted to a balance of a timepiece movement and made from a binary alloy containing niobium and titanium.

According to the invention, the balance spring is made from a niobium and titanium alloy containing:
niobium: the remainder to 100 wt %,
titanium: between 40 and 60 wt %,
traces of elements selected from the group formed of O, H, C, Fe, Ta, N, Ni, Si, Cu, Al, each of said elements being present in an amount comprised between 0 and 1600 ppm by weight, the total amount formed by all of said elements being comprised between 0 and 0.3 wt %, said alloy having an elastic limit higher than or equal to 600 MPa and a modulus of elasticity lower than 100 GPa.

According to the invention, said NbTi alloy is coated with a surface layer of a ductile material chosen from the group including copper, nickel, cupronickel, cupro manganese, gold, silver, nickel phosphorus NiP and nickel boron NiB.

The retained surface layer of ductile material makes it possible to obtain a perfectly regular final wire cross-section. The ductile material may preferably be copper or gold.

Advantageously, the balance spring may include, on the surface layer of ductile material, a final layer of a material selected from the group including copper, nickel, cupronickel, cupro manganese, silver, nickel phosphorus NiP, nickel boron NiB, gold, provided that the material of the final layer is different from the ductile material of the surface layer, $Al_2O_3$, $TiO_2$, $SiO_2$ et AlO. This final layer has a thickness of 0.1 µm to 1 µm and makes it possible to dye the balance spring or to obtain resistance to weathering (temperature and humidity).

Advantageously, the alloy used in the present invention includes between 40 and 49 wt % of titanium, preferably between 44 and 49 wt % of titanium, and more preferably between 46 and 48 wt % of titanium, and preferably said alloy includes more than 46.5 wt % of titanium and said alloy includes less than 47.5 wt % of titanium.

If the titanium content is too high, a martensite phase appears, causing problems of brittleness of the alloy during use. If the niobium content is too high, the alloy will be too soft. The development of the invention has allowed a compromise to be determined, with an optimum between these two characteristics close to 47 wt % of titanium.

In addition, more particularly, the titanium content is higher than or equal to 46.5 wt % with respect to the total composition.

More particularly, the titanium content is less than or equal to 47.5 wt % with respect to the total composition.

In a particularly advantageous manner, the NbTi alloy used in the present invention does not include any other elements except any inevitable traces. This makes it possible to avoid the formation of brittle phases.

More particularly, the oxygen content is less than or equal to 0.10 wt % of the total, or less than or equal to 0.085 wt % of the total.

More particularly, the tantalum content is less than or equal to 0.10 wt % of the total.

More particularly, the carbon content is less than or equal to 0.04 wt % of the total, in particular less than or equal to 0.020 wt % of the total, or less than or equal to 0.0175 wt % of the total.

More particularly, the iron content is less than or equal to 0.03 wt % of the total, in particular less than or equal to 0.025 wt % of the total, or less than or equal to 0.020 wt % of the total.

More particularly, the nitrogen content is less than or equal to 0.02 wt % of the total, in particular less than or equal to 0.015 wt % of the total, or less than or equal to 0.0075 wt % of the total.

More particularly, the hydrogen content is less than or equal to 0.01 wt % of the total, in particular less than or equal to 0.0035 wt % of the total, or less than or equal to 0.0005 wt % of the total.

More particularly, the silicon content is less than or equal to 0.01 wt % of the total.

More particularly, the nickel content is less than or equal to 0.01 wt % of the total, in particular less than or equal to 0.16 wt % of the total.

More particularly, the content of ductile material, such as copper, in the alloy, is less than or equal to 0.01 wt % of the total, in particular less than or equal to 0.005 wt % of the total.

More particularly, the aluminium content is less than or equal to 0.01 wt % of the total.

The balance spring of the invention has an elastic limit higher than or equal to 600 MPa.

Advantageously, this balance spring has a modulus of elasticity lower than or equal to 100 GPa, and preferably comprised between 60 GPa and 80 GPa.

Further, the balance spring according to the invention has a thermoelastic coefficient or 'TEC' that ensures chronometric performance is maintained despite the variation in operating temperatures of a watch incorporating such a balance spring.

To form a chronometric oscillator that meets the conditions of the Official Swiss Chronometer Testing Institute (COSC), the TEC of the alloy must be close to zero (±10 ppm/° C.) to obtain a temperature coefficient of the oscillator equal to ±0.6 s/d/° C.

The formula that links the TEC of the alloy and the expansion coefficients of the balance spring and the balance is as follow's:

$$CT = \frac{dM}{dT} = \left(\frac{1}{2E}\frac{dE}{dT} - \beta + \frac{3}{2}\alpha\right) \times 86400 \frac{s}{j° \, C.}$$

Variables M and T are respectively rate and temperature. E is the Young's modulus of the balance spring, and, in this formula, E, β and α are expressed in ° C.$^{-1}$.

TC is the temperature coefficient of the oscillator, (1/E. dE/dT) is the TEC of the balance spring alloy, β is the expansion coefficient of the balance and a that of the balance spring.

It is easy to obtain a suitable TEC and therefore TC according to the surface layer and any final layer during implementation of the various steps of the invention, as will be seen hereinafter.

According to a first variant, said niobium and titanium alloy of the balance spring has a single phase structure wherein the titanium is essentially in solid solution form with β-phase niobium, the α-phase titanium content being less than or equal to 10% by volume, preferably less than or equal to 5% by volume, and more preferably less than or equal to 2.5% by volume.

According to a second variant, said balance spring has a two-phase structure comprising a solid solution of niobium with β-phase titanium and a solid solution of niobium with α-phase titanium, the α-phase titanium content being greater than 10% by volume.

The present invention also concerns a method for manufacturing a balance spring made of a binary NbTi alloy as defined above, said method including:
  a step of creating a blank from a niobium and titanium alloy containing:
    niobium: the remainder to 100 wt %,
    titanium: between 40 and 60 wt %,
    traces of elements selected from the group formed of O, H, C, Fe, Ta, N, Ni, Si, Cu, Al, each of said elements being present in an amount comprised between 0 and 1600 ppm by weight, the total amount formed by all of said elements being comprised between 0 and 0.3 wt %,
  a step of β-quenching said blank with a given diameter, such that the titanium of said alloy is essentially in solid solution form with β-phase niobium, the α-phase titanium content being less than or equal to 5% by volume and more preferably less than or equal to 2.5% by volume,
  at least one deformation step of said alloy alternated with at least one heat treatment step such that the niobium and titanium alloy obtained has an elastic limit higher than or equal to 600 MPa and a modulus of elasticity lower than or equal to 100 GPa, a winding step to form the balance spring being performed prior to the last heat treatment step, this last step making it possible to fix the shape of the balance spring and adjust the thermoelastic coefficient, and, prior to the deformation step, a step of depositing, on the alloy blank, a surface layer of a ductile material chosen from the group including copper, nickel, cupronickel, cupro manganese, gold, silver, nickel phosphorus NiP and nickel boron NiB, said surface layer of ductile material being retained on the balance spring, the thermoelastic coefficient of the niobium and titanium alloy being adapted accordingly.

As will be seen hereinafter, the thermoelastic coefficient of the niobium and titanium alloy can easily be adjusted by selecting a suitable deformation rate and suitable heat treatments.

Advantageously, the thickness of the deposited ductile material layer is chosen such that the ratio of the area of ductile material to the area of NbTi alloy for a given cross-section of wire is less than 1, preferably less than 0.5, and more preferably comprised between 0.01 and 0.4.

This thickness of ductile material, and especially copper, makes it possible to easily draw, wire draw and roll the composite Cu/NbTi material.

The ductile material, preferably copper, is thus deposited at a given time to facilitate the wire shaping process by drawing and wire drawing, so that there remains a thickness preferably comprised between 1 and 500 micrometres on the wire with the final diameter of 0.2 to 1 millimetre.

Further, the surface layer of ductile material retained makes it possible to obtain a perfectly regular final wire cross-section.

The addition of ductile material, especially copper, may be a galvanic, PVD or CVD, or mechanical process, it is then a sleeve or tube of ductile material such as copper, which is fitted to a niobium-titanium alloy bar with a rough diameter, which is then thinned out during the deformation steps of the composite bar.

The ductile material can be preferably copper or gold, deposited by galvanic means, PVD or CVD.

The method of the invention may also include a step of depositing, on the retained surface layer of ductile material, a final layer of a material chosen from the group including $Al_2O_3$, $TiO_2$, $SiO_2$ and AlO, by PVD or CVD. A final gold layer can also be provided, deposited by gold flash plating if gold has not already been used as the ductile material of the surface layer. It is also possible to use copper, nickel, cupronickel, cupro manganese, silver, nickel phosphorus NiP and nickel boron NiB for the final layer, provided that the material of the final layer is different from the ductile material of the surface layer.

This final layer has a thickness of 0.1 µm to 1 µm and makes it possible to dye the balance spring or to obtain resistance to weathering (temperature and humidity).

Preferably, the β quenching is a solution treatment, with a duration comprised between 5 minutes and 2 hours at a temperature comprised between 700° C. and 1000° C., under vacuum, followed by gas cooling.

More particularly still, the beta quenching is a solution treatment, between 5 minutes and 1 hour at 800° C. under vacuum, followed by gas cooling.

Preferably, the heat treatment is carried out for a duration of between 1 hour and 80 hours or longer, preferably between 1 hour and 15 hours at a temperature comprised between 350° C. and 700° C. More preferably, the heat treatment is carried out for a duration of between 5 hours and 10 hours at a temperature comprised between 350° C. and 600° C. Still more preferably, the heat treatment is carried out for a duration of between 3 hours and 6 hours at a temperature comprised between 400° C. and 500° C.

A deformation step refers generally to one or more deformation treatments, which can include wire drawing and/or rolling. Wire drawing may require the use of one or more dies during the same deformation step or during various deformation steps if necessary. Wire drawing is performed until a wire of round cross-section is obtained. Rolling can be carried out in the same deformation step as wire drawing or in another, subsequent deformation step. Advantageously, the last deformation treatment applied to the alloy is a rolling process, preferably with a rectangular profile compatible with the feed cross-section of a winder spindle.

In a particularly advantageous manner, the total deformation rate, the number of heat treatments and the heat treatment parameters are selected to obtain a balance spring with a thermoelastic coefficient as close as possible to 0. Further, depending on the total deformation rate, the number of heat treatments and heat treatment parameters, a single phase or two-phase NbTi alloy is obtained.

More particularly, according to a first variant, the number of heat treatment and deformation steps is limited, such that the niobium and titanium alloy of the balance spring obtained retains a structure in which the titanium of said alloy is essentially in solid solution form with β-phase niobium (cubic centred structure), the α-phase titanium content being less than or equal to 10% by volume, preferably less than or equal to 5% by volume, and more preferably less than or equal to 2.5% by volume.

Preferably, the total deformation rate is comprised between 1 and 5, preferably between 2 and 5.

In a particularly advantageous manner, there is used a blank whose dimensions are as close as possible to the desired final dimensions so as to limit the number of heat treatment and deformation steps and to retain an essentially single β-phase structure of the NbTi alloy. The final structure of the NbTi alloy of the balance spring may be different from the initial structure of the blank, for example the α-phase titanium content may have varied, the essential point being that the final structure of the NbTi alloy of the balance spring is essentially single phase, the titanium of said alloy being essentially in solid solution form with β-phase niobium, the α-phase titanium content being less than or equal to 10% by volume, preferably less than or equal to 5% by volume, more preferably less than or equal to 2.5% by volume. In the blank alloy after β quenching, the α-phase titanium content is preferably less than or equal to 5% by volume, more preferably less than or equal to 2.5% by volume, or even close or equal to 0.

Thus, according to this variant, there is obtained a balance spring made from a NbTi alloy having an essentially single phase structure in β-Nb—Ti solid solution form, the α-phase titanium content being less than or equal to 10% by volume, preferably less than or equal to 5% by volume, more preferably less than or equal to 2.5% by volume.

Preferably, the method comprises a single deformation step with a deformation rate comprised between 1 and 5, preferably between 2 and 5.

Thus, a particularly preferred method of the invention includes, after the β quenching step, the step of depositing, on the alloy blank, a surface layer of ductile material, a deformation step including wire drawing through several dies, then a rolling process, a winding step and then a last heat treatment step (called fixing).

The method of the invention may further comprise at least one intermediate heat treatment step, such that the method comprises, for example, after the β quenching step, the step of depositing, on the alloy blank, the surface layer of ductile material, a first deformation step, an intermediate heat treatment step, a second deformation step, the winding step and then a last heat treatment step.

The higher the deformation rate after the β quenching step, the more positive the temperature coefficient TC will be. The more the material is annealed after the β quenching step, within the suitable temperature range, by the various heat treatments, the more negative the temperature coefficient TC becomes. A suitable choice of deformation rate and of heat treatment parameters makes it possible to bring the single phase NbTi alloy to a TEC close to zero, which is particularly advantageous.

According to a second variant, a series of sequences of a deformation step alternated with a heat treatment step is applied until a niobium and titanium alloy is obtained with a two-phase structure comprising a solid solution of niobium with β-phase titanium (body-centred cubic structure) and a solid solution of niobium with α-phase titanium (hexagonal close packed structure), wherein the α-phase titanium content is greater than 10% by volume.

To obtain such a two-phase structure, it is necessary to precipitate part of the α-phase by heat treatments, according to the aforementioned parameters, with high deformation between the heat treatments. Preferably, however, longer heat treatments are applied than those used to obtain a single phase spring alloy, for example heat treatments performed for a duration of between 15 hours and 75 hours at a temperature comprised between 350° C. and 500° C. For example, heat treatments are applied from 75 hours to 400 hours at 350° C., for 25 hours at 400° C. or for 18 hours at 480° C.

In this second 'two-phase' variant, a blank is used which has, after the β quenching, a much larger diameter than that of the blank prepared for the first 'single-phase' variant. Thus, in the second variant, there is used, for example, a 30 mm diameter blank after β quenching, whereas, for the first variant, a 0.2 to 2.0 mm diameter blank is used after β quenching.

Preferably, in these pairs of deformation/heat treatment sequences, each deformation is performed with a deformation rate comprised between 1 and 5, the cumulative total of deformations over all of said succession of sequences providing a total deformation rate comprised between 1 and 14.

The deformation rate satisfies the conventional formula 2 ln(d0/d), wherein d0 is the diameter of the last beta quenching or that of a deformation step, and d is the diameter of the hardened wire obtained in the following deformation step.

Advantageously, the method includes in this second variant between three and five pairs of deformation/heat treatment sequences.

More particularly, the first pair of deformation/heat treatment sequences includes a first deformation with at least a 30% reduction in cross-section.

More particularly, each pair of deformation/heat treatment sequences, apart from the first, includes one deformation between two heat treatments with at least a 25% reduction in cross-section.

In this second variant, the cold-worked β-phase alloy has a strongly positive TC, and precipitation of the α-phase that has a strongly negative TC allows the two-phase alloy to be brought to a TEC close to zero, which is particularly advantageous.

The method of the invention thus makes it possible to produce, and more specifically to shape, a balance spring for a balance made of a niobium-titanium alloy, typically with 47 wt % of titanium (40-60%), having an essentially single phase β-Nb—Ti microstructure wherein the titanium is in solid solution form with β-phase niobium or a very thin two-phase lamellar microstructure including a solid solution of niobium with β-phase titanium and a solid solution of niobium with α-phase titanium. Further, the balance spring has a perfectly regular final cross-section, with no irregularities or wire? at the surface. The NbTi alloy has high mechanical properties, combining a very high elastic limit, higher than 600 MPa, and a very low modulus of elasticity, on the order of 60 GPa to 80 GPa. This combination of properties is well suited to a balance spring.

Such an alloy is known and used for the manufacture of superconductors, such as magnetic resonance imaging devices, or particle accelerators, but is not used in horology.

A binary alloy containing niobium and titanium, of the aforementioned type for implementation of the invention, also has a similar effect to that of 'Elinvar', with a virtually zero thermoelastic coefficient in the normal operating temperature range of watches, and suitable for fabricating self-compensating balance springs.

Further, such an alloy is paramagnetic.

The invention claimed is:

1. A balance spring intended to be fitted to a balance of a timepiece movement, the balance spring being made from a niobium and titanium alloy containing:
    niobium: the remainder to 100 wt %,
    titanium: between 40 and 60 wt %,
    traces of elements selected from the group formed of O, H, C, Fe, Ta, N, Ni, Si, Cu, Al, each of said elements being present in an amount comprised between 0 and 1600 ppm by weight, the total amount formed by all of said elements being comprised between 0 and 0.3 wt %,
    said alloy having an elastic limit higher than or equal to 600 MPa and a modulus of elasticity less than 100 GPa,
    wherein said alloy is coated with a surface layer of a ductile material chosen from the group including copper, nickel, cupronickel, cupro manganese, gold, silver, nickel phosphorus NiP and nickel-boron Ni—B.

2. The balance spring according to claim 1, wherein the spring comprises, on the surface layer of ductile material, a final layer of a material chosen from the group including copper, nickel, cupronickel, cupro manganese, silver, nickel phosphorus NiP, nickel-boron NiB, gold, chosen to be different from the ductile material of the surface layer, Al2O3, TiO2, SiO2 and AlO.

3. The balance spring according to claim 1, wherein said alloy includes between 40 and 49 wt % of titanium.

4. The balance spring according to claim 1, wherein said alloy includes more than 46.5 wt % of titanium.

5. The balance spring according to claim 1, wherein said alloy includes less than 47.5 wt % of titanium.

6. The balance spring according to claim 1, wherein said niobium and titanium alloy has a single phase structure wherein the titanium is essentially in solid solution form with β-phase niobium, the α-phase titanium content being less than or equal to 10% by volume.

7. The balance spring according to claim 6, wherein the α-phase titanium content is less than or equal to 5% by volume.

8. The balance spring according to claim 1, wherein said niobium and titanium alloy has a two-phase microstructure comprising a solid solution of niobium with β-phase titanium and a solid solution of niobium with α-phase titanium, the α-phase titanium content being greater than 10% by volume.

9. A method for manufacturing a balance spring intended to be fitted to a balance of a timepiece movement, comprising:
  a step of creating a blank from a niobium and titanium alloy containing:
  niobium: the remainder to 100 wt %,
  titanium: between 40 and 60 wt %,
  traces of elements selected from the group formed of O, H, C, Fe, Ta, N, Ni, Si, Cu, Al, each of said elements being present in an amount comprised between 0 and 1600 ppm by weight, the total amount formed by all of said elements being comprised between 0 and 0.3 wt %,
  a step of β-quenching said blank with a given diameter, such that the titanium of said alloy is essentially in solid solution form with β-phase niobium, the α-phase titanium content being less than or equal to 5% by volume,
  at least one deformation step of said alloy alternated with at least one heat treatment step such that the niobium and titanium alloy obtained has an elastic limit higher than or equal to 600 MPa and a modulus of elasticity lower than or equal to 100 GPa, a winding step to form the balance spring being performed prior to the final heat treatment step,
  wherein, prior to the deformation step, the method comprises a step of depositing, on the alloy blank, a surface layer of a ductile material chosen from the group including copper, nickel, cupronickel, cupro manganese, gold, silver, nickel phosphorus NiP and nickel boron NiB, said surface layer of ductile material being retained on the balance spring, the thermoelastic coefficient of the niobium and titanium alloy being adapted accordingly.

10. The manufacturing method according to claim 9, wherein the thickness of the deposited ductile material layer is chosen such that the ratio of the area of ductile material to the area of NbTi alloy for a given cross-section of wire is less than 1.

11. The manufacturing method according to claim 9, wherein the method comprises a step of depositing, on the surface layer of ductile material retained on the balance spring, a final layer of a material chosen from the group containing copper, nickel, cupronickel, cupro manganese, silver, nickel phosphorus NiP, nickel-boron NiB, gold, chosen to be different from the ductile material of the surface layer, Al2O3, TiO2, SiO2 and AlO.

12. The method according to claim 9, wherein the deformation step includes a wire drawing and/or a rolling process.

13. The method according to claim 12, wherein the last deformation treatment applied to the alloy is a rolling process.

14. The method according to claim 9, wherein the total deformation rate, the number of heat treatments and the heat treatment parameters are chosen to obtain a balance spring having a thermoelastic coefficient as close as possible to 0.

15. The manufacturing method according to claim 9, wherein said β-quenching step is a solution treatment, with a duration comprised between 5 minutes and 2 hours at a temperature comprised between 700° C. and 1000° C., under vacuum, followed by gas cooling.

16. The manufacturing method according to claim 9, wherein the heat treatment is performed for a duration of between 1 hour and 80 hours at a temperature comprised between 350° C. and 700° C.

17. The manufacturing method according to claim 9, wherein the number of heat treatment and deformation steps is limited such that the niobium and titanium alloy of the balance spring obtained retains a structure in which the titanium of said alloy is essentially in solid solution form with β-phase niobium, the α-phase titanium content being less than or equal to 10% by volume.

18. The manufacturing method according to claim 17, wherein the heat treatment is performed for a duration of between 5 hours and 10 hours at a temperature comprised between 350° C. and 600° C.

19. The manufacturing method according to claim 18, wherein the heat treatment is performed for a duration of between 3 hours and 6 hours at a temperature comprised between 400° C. and 500° C.

20. The method according to claim 17, wherein the method comprises a single deformation step with a deformation rate comprised between 1 and 5.

21. The method according to claim 17, wherein after the β quenching step, the method comprises a deformation step, a winding step and a heat treatment step.

22. The method according to claim 21, wherein the method comprises an intermediate heat treatment step.

23. The manufacturing method according to claim 9, wherein there is applied a succession of sequences of a deformation step alternated with a heat treatment step, until a niobium and titanium alloy with two-phase microstructure is obtained comprising a solid solution of niobium with β-phase titanium and a solid solution of niobium with α-phase titanium, the a-phase titanium content being greater than 10% by volume.

24. The manufacturing method according to claim 23, wherein each deformation is performed with a deformation rate comprised between 1 and 5, the cumulative total of deformations over all of said succession of sequences leading to a total deformation rate comprised between 1 and 14.

25. The manufacturing method according to claim 23, wherein the heat treatment is performed for a duration of between 15 hours and 75 hours at a temperature comprised between 350° C. and 500° C.

* * * * *